(12) United States Patent
Terada et al.

(10) Patent No.: US 8,113,724 B2
(45) Date of Patent: Feb. 14, 2012

(54) OPTICAL COMMUNICATION MODULE, MANUFACTURING METHOD THEREFOR, AND OPTICAL TRANSCEIVER

(75) Inventors: Yoshihiro Terada, Sakura (JP); Masakazu Ohashi, Sakura (JP); Koji Azegami, Sakura (JP); Kentaro Ichii, Sakura (JP)

(73) Assignee: Fujikura Ltd., Tokyo (JP)

( * ) Notice: Subject to any disclaimer, the term of this patent is extended or adjusted under 35 U.S.C. 154(b) by 36 days.

(21) Appl. No.: 12/618,626

(22) Filed: Nov. 13, 2009

(65) Prior Publication Data
US 2010/0061684 A1 Mar. 11, 2010

Related U.S. Application Data

(63) Continuation of application No. PCT/JP2008/053036, filed on Feb. 22, 2008.

(30) Foreign Application Priority Data

May 14, 2007 (JP) ................................. 2007-127810

(51) Int. Cl.
*G02B 6/36* (2006.01)
*H01L 33/00* (2010.01)
(52) U.S. Cl. ................ 385/88; 385/89; 385/90; 385/91; 385/92; 257/98; 257/99
(58) Field of Classification Search .............. 385/88–92; 257/98–99
See application file for complete search history.

(56) References Cited

U.S. PATENT DOCUMENTS

| | | | |
|---|---|---|---|
| 6,019,523 A * | 2/2000 | Honmou | 385/94 |
| 6,425,695 B1 * | 7/2002 | Murata et al. | 385/88 |
| 6,837,627 B2 * | 1/2005 | Nakanishi et al. | 385/92 |
| 7,224,857 B2 * | 5/2007 | Liu | 385/14 |
| 2006/0198569 A1 * | 9/2006 | Ohtsu et al. | 385/14 |
| 2007/0114547 A1 | 5/2007 | Fujita et al. | |
| 2009/0067779 A1 * | 3/2009 | Furuyama | 385/14 |

FOREIGN PATENT DOCUMENTS

| | | |
|---|---|---|
| JP | 5-333251 A | 12/1993 |
| JP | 8-220368 A | 8/1996 |
| JP | 2001-249245 A | 9/2001 |
| JP | 3392748 B2 | 3/2003 |
| JP | 2004-253638 A | 9/2004 |
| JP | 2004-309570 A | 11/2004 |

(Continued)

*Primary Examiner* — Brian M. Healy
*Assistant Examiner* — Guy Anderson
(74) *Attorney, Agent, or Firm* — Sughrue Mion, PLLC

(57) ABSTRACT

A manufacturing method of an optical communication module for manufacturing the optical communication module, including the sequentially performed steps of: (1) mounting a light-emitting element and a light-receiving element on a side surface of a sub-mount substrate and mounting the sub-mount substrate on a printed circuit board such that the light-emitting and -receiving directions of the light-emitting element and light-receiving element are parallel to the printed circuit board; (2) aligning an optical waveguide; and (3) dropping resin solution on an area of the sub-mount substrate including an optical waveguide end and the light-emitting element or the light-receiving element, and curing the resin solution. According to the present invention, it is possible to provide an optical communication module which can be made thin, small and cheap.

14 Claims, 12 Drawing Sheets

FOREIGN PATENT DOCUMENTS

| | | |
|---|---|---|
| JP | 2005-134600 A | 5/2005 |
| JP | 2005-159265 A | 6/2005 |
| JP | 2005-172989 A | 6/2005 |
| JP | 2005-202025 A | 7/2005 |
| JP | 2005-284248 A | 10/2005 |
| JP | 2006-11179 A | 1/2006 |
| JP | 2006-30463 A | 2/2006 |
| JP | 2006-257353 A | 9/2006 |
| JP | 2006-337550 A | 12/2006 |
| WO | 00/08729 A1 | 2/2000 |

* cited by examiner (a)

(b)

(FIBER DEVIATION ANGLE 5°, g IS 0.03mm OR LESS)

(a)

(b)

(c)

US 8,113,724 B2

OPTICAL COMMUNICATION MODULE, MANUFACTURING METHOD THEREFOR, AND OPTICAL TRANSCEIVER

TECHNICAL FIELD

The present invention relates to an optical communication module formed by joining a light-emitting element and a light-receiving element to an optical waveguide, manufacturing method therefor, and an optical transceiver.

Priority is claimed on Japanese Patent Application No. 2007-127810, filed May 14, 2007, the content of which is incorporated herein by reference.

This application is a continuation application based on a PCT Patent Application No. PCT/JP2008/053036, filed Feb. 22, 2008, whose priority is claimed on Japanese Patent Application No. 2007-127810 filed May 14, 2007, the entire content of which are hereby incorporated by reference.

BACKGROUND ART

An optical communication module is preferably small in size and low cost. In recent years, a VCSEL (vertical cavity surface emitting laser) has been examined as a light-emitting element used in an optical communication module. For convenience of the manufacturing process, a bare chip of the VCSEL generally has a configuration with a surface with a light-emitting portion and a back surface of the light-emitting portion where an anode and a cathode are provided, as shown in FIG. 1. In FIG. 1, reference numeral 1 denotes a cathode, reference numeral 2 denotes an anode, reference numeral 3 denotes a light-emitting portion, reference numeral 4 denotes a VCSEL, and reference numeral 5 denotes a bonding wire. In this illustration, for the anode 2, the entire back surface of the chip is a solid electrode. In addition, without being limited to this illustration, there is also a chip in which the anode 2 and the cathode 1 are opposite to those described above.

Accordingly, when manufacturing an optical communication module by mounting a light-emitting element, such as the VCSEL 4, on the printed circuit board with a known structure, light is emitted only in the direction perpendicular to the printed circuit board. In addition, the same is true for a light-receiving element; light is received only in the direction perpendicular to the printed circuit board.

In order to mount such a light-emitting element and a light-receiving element on the printed circuit board and to join the optical waveguide to them, methods such as the following (A) and (B) are used.

(A) Method of disposing an optical waveguide 11 vertically with respect to a printed circuit board 15 on which an IC 12 and a VCSEL 14 are mounted and joining it to a light-emitting portion 13 of the VCSEL 14, as shown in FIG. 2.

(B) Method of disposing an optical waveguide 21 horizontally with respect to a printed circuit board 25 on which an IC 22 and a VCSEL 24 are mounted, providing a mirror with an inclination of 45° and the like at the tip of the optical waveguide 21, and reflecting the light emitted from a light-emitting portion 23 of the VCSEL 24 by using the mirror so that the light is incident on the optical waveguide 21 and is coupled thereto, as shown in FIG. 3.

The known techniques regarding the present invention, for example, are disclosed in Patent Documents 1 to 4.

In recent years, optical wiring has been applied to high-speed communication apparatuses such as servers, optical wiring in automobiles, and small electronic apparatuses such as mobile phones. As efforts are being made to reduce the size and cost of such apparatuses, there is also a strong demand for miniaturization and low cost of optical transceivers. As light-emitting elements used for the optical transceiver, a laser diode (LD), a light-emitting diode (LED), and a vertical cavity surface emitting laser (VCSEL) are used. In addition, a photodiode is used as a light-receiving element. A fiber type or sheet type waveguide is used as the optical waveguide, and are made of silica glass, a polymer, or the like. For the structure and method of joining a light-emitting or receiving element to an optical waveguide in an optical transceiver, various methods have been examined (for example, refer to Patent Documents 5 to 8).

[Patent Document 1] Japanese Patent Application Laid-Open Publication No. 2004-309570
[Patent Document 2] Japanese Unexamined Patent Application, First Publication No. 2005-134600
[Patent Document 3] Japanese Unexamined Patent Application, First Publication No. 2004-253638
[Patent Document 4] Japanese Unexamined Patent Application, First Publication No. 2005-284248
[Patent Document 5] Japanese Unexamined Patent Application, First Publication No. 2006-11179
[Patent Document 6] Japanese Unexamined Patent Application, First Publication No. 2005-202025
[Patent Document 7] Japanese Patent Publication No. 3392748
[Patent Document 8] Japanese Unexamined Patent Application, First Publication No. 8-220368

DISCLOSURE OF THE INVENTION

Problem that the Invention is to Solve

In the optical communication modules having the known structures disclosed in Patent Documents 1 to 4, however, the maximum height on the substrate increases inevitably when joining the light-emitting element to the optical waveguide. As a result, there is a problem in that such a module is difficult to be mounted in mobile consumer products, such as miniaturized communication apparatuses, mobile phones, and notebook computers.

Moreover, in the structure where the 45° mirror is provided on the end of the optical waveguide, there is a problem in that the production cost is increased even though the height on the substrate can be slightly lower.

In addition, there are the following problems in the known techniques disclosed in Patent Documents 5 to 8. As shown in FIG. 3, Patent Document 5 discloses a method for disposing the optical waveguide 21 horizontally with respect to the printed circuit board 25 on which the IC 22 and the VCSEL 24 are mounted, providing a mirror with an inclination of 45° and the like at the tip of the optical waveguide 21, and reflecting the light emitted from the light-emitting portion 23 of the VCSEL 24 by the mirror so that the light is incident on the optical waveguide 21 and is coupled thereto. In this method, however, there is a problem in that it takes a significant amount of time and cost to form the 45° mirror. In addition, there is also a problem in that it takes a significant amount of time and cost to perform optical axis alignment of the VCSEL 24 and the optical waveguide 21 due to diffusion on the surface of the 45° mirror and extension of the optical path length. Since a certain area is required for attaching a mirror and a lens, or space (focal distance) for operating the mirror and the lens, it is not compatible with miniaturization.

Patent Document 6 discloses a method for making the light emitted from a light-emitting device incident on a waveguide, monitoring the output at the emission end of the waveguide with a light-receiving device, and moving the light-emitting device, the light-receiving device, and the waveguide relative to each other and fixing them such that the output is maximized. However, in this method, it takes a significant amount of time to make adjustments. Particularly when a plurality of optical waveguides is connected, the efficiency is low, and this results in an increase in cost.

Patent Document 7 uses an LD as a light source. The LD is mounted on the silicon substrate (equivalent to a sub-mount) and the entire LD, the waveguide end, and a part of the bonding wire are covered by a resin. However, the silicon substrate is for heat dissipation but is not for adjusting the light-emitting direction of the LD. Since the entire silicon substrate (sub-mount) is not covered with the resin, it does not have the function of improving the bonding strength of the silicon substrate to the stem (equivalent to a printed circuit board) either. In addition, since a part of the bonding wire is exposed from the resin, there is no function of protecting the bonding wire. In addition, since the VCSEL is not used, power consumption is high and it is expensive.

Patent Document 8 uses an LD as a light source. The LD is mounted on the silicon substrate (equivalent to the sub-mount) and the entire LD, the waveguide end, and the entire silicon substrate are covered by a resin. However, the purpose of the silicon substrate is heat dissipation and not to adjust the light-emitting direction of the LD. In addition, since the VCSEL is not used, power consumption is high and it is expensive.

The present invention has been made in view of the above situation, and has an object of providing an optical communication module and an optical transceiver which can be made to be thin, small and cheap.

Means for Solving the Problem

In order to achieve the above-described object, the present invention provides an optical communication module including: a printed circuit board; a sub-mount substrate in which one or both a light-emitting element and a light-receiving element are mounted on a side surface thereof; and an optical waveguide provided between the light-emitting element and the light-receiving element so as to be able to be optically coupled with the light-emitting element and the light-receiving element. The light-emitting element and the light-receiving element are mounted on the printed circuit board with the sub-mount substrate therebetween such that the light-emitting and receiving directions of the elements are parallel to the printed circuit board. The light-emitting element and the light-receiving element of the sub-mount substrate and ends of the optical waveguide adjacent to the elements are covered by a resin.

In addition, the present invention provides a manufacturing method of an optical communication module for manufacturing the optical communication module, including the sequentially performed step of: (1) mounting a light-emitting element and a light-receiving element on a side surface of a sub-mount substrate and mounting the sub-mount substrate on a printed circuit board such that the light-emitting and receiving directions of the light-emitting element and light-receiving element are parallel to the printed circuit board; (2) aligning an optical waveguide; and (3) dropping a resin solution on an area of the sub-mount substrate portion including an optical waveguide end and the light-emitting element or the light-receiving element and of curing the resin solution.

In addition, the present invention provides an optical transceiver including: a printed circuit board; a sub-mount substrate in which one or both a light-emitting element and a light-receiving element are mounted on a side surface thereof; and an optical waveguide provided between the light-emitting element and the light-receiving element so as to be able to be optically coupled with the light-emitting element and the light-receiving element. The light-emitting element and the light-receiving element each have structures in which a surface in contact with the substrate and a surface through which light is emitted or received are at the top and bottom positions and the light is emitted or received in a direction perpendicular to the mounted substrate. The light-emitting element and the light-receiving element are mounted on the printed circuit board with the sub-mount substrate therebetween such that the light-emitting and receiving directions of the elements are not perpendicular to the printed circuit board. The entire sub-mount substrate, the entire light-emitting element, the entire light-receiving element, and ends of the optical waveguide adjacent to the elements are collectively covered by a resin.

Advantage of the Invention

The optical communication module of the present invention has a configuration where the light-emitting element and the light-receiving element are mounted on the printed circuit board through the sub-mount substrate such that the light-emitting and receiving directions of the elements are parallel to the printed circuit board and the light-emitting element and the light-receiving element of the sub-mount substrate and the ends of the optical waveguide are fixed by covering them with a resin. Accordingly, since it is possible to emit and receive the light in a direction parallel to the printed circuit board, reduction in height (thickness) and miniaturization of the optical communication module can be realized.

In addition, since additional optical components, such as mirrors for changing the light-emitting and receiving directions, are not necessary, a small and thin optical communication module can be cheaply provided.

According to the manufacturing method of the optical communication module of the present invention, a thin and small optical communication module can be produced efficiently and cheaply.

The optical transceiver of the present invention has a structure where an element is used which has a structure in which a surface in contact with the substrate and a surface through which light is emitted or received are at the top and bottom positions and the light is emitted or received in a direction perpendicular to the substrate when it is normally mounted, the light-emitting or receiving element, the sub-mount substrate and the optical waveguide are collectively covered by the resin, the light-emitting or receiving element is mounted on the side surface of the sub-mount substrate, and it is mounted on the printed circuit board. Accordingly, an optical transceiver whose heat generation and power consumption are low can be provided.

In addition, since light can be emitted or received in an arbitrary direction according to the application, it is possible to provide an optical transceiver that can be widely applied.

In addition, since the optical transceiver of the present invention has the above-described configuration, it can be provided at a low cost.

Moreover, by adopting a configuration where part of the printed circuit board is covered by the resin, the strength can be increased when it is mounted onto the printed circuit board. As a result, the reliability of the apparatus can be improved.

In addition, since bonding wires of the light-emitting and receiving elements are also covered by a resin, the bonding wires can be protected. As a result, the reliability of the apparatus can be improved.

DESCRIPTION OF REFERENCE NUMERALS AND SIGNS

31: SUB-MOUNT SUBSTRATE
32: LIGHT-EMITTING OR RECEIVING ELEMENT (VCSEL OR PD)
33: GOLD WIRE
34: BOTTOM SURFACE ELECTRODE
35: SIDE SURFACE ELECTRODE
41: FIBER TAPE
42: FIBER TYPE OPTICAL WAVEGUIDE
43: TAPING MATERIAL
51: DISPENSER NOZZLE
52: POLYMER CLADDING FIBER
53: SUB-MOUNT SUBSTRATE
54: VCSEL
55: PD
56: PRINTED CIRCUIT BOARD
57: UV-CURABLE RESIN
61: VCSEL
62: SUB-MOUNT SUBSTRATE
63: GOLD WIRE
64: PRINTED CIRCUIT BOARD
65: ELECTRODE
71: PD
72: SUB-MOUNT SUBSTRATE
73: GOLD WIRE
74: PRINTED CIRCUIT BOARD
75: ELECTRODE
76: OPTICAL FIBER
77: IN-CURABLE RESIN
80: OPTICAL COMMUNICATION MODULE
81, 82: PRINTED CIRCUIT BOARD
83: OPTICAL FIBER
100: OPTICAL TRANSCEIVER
101~103: PRINTED CIRCUIT BOARD
104~106: SUB-MOUNT SUBSTRATE
107: LIGHT-EMITTING ELEMENT
108: LIGHT-RECEIVING ELEMENT
109: OPTICAL WAVEGUIDE
110: RESIN
111: TAPE SHEET
112A~112D: SIDE SURFACE
113: BOTTOM SURFACE
114: PRINTED CIRCUIT BOARD
115: SUB-MOUNT SUBSTRATE
116: LIGHT-EMITTING OR RECEIVING ELEMENT
123: HEAD MOUNTED DISPLAY
124: TEST SUBJECT
125: CONTROL DEVICE
126: OPTICAL WAVEGUIDE
127: PRINTED CIRCUIT BOARD
128: SUB-MOUNT SUBSTRATE
129: OPTICAL WAVEGUIDE
130: MOBILE PHONE
131: LIQUID CRYSTAL DISPLAY
132: KEYPAD
133: CAMERA MODULE

134~135: PRINTED CIRCUIT BOARD
136: OPTICAL WAVEGUIDE
137: SUB-MOUNT SUBSTRATE
138: VCSEL
139: RESIN
140: OPTICAL TRANSCEIVER
141: PRINTED CIRCUIT BOARD
142: SUB-MOUNT SUBSTRATE
143: LIGHT-EMITTING ELEMENT
144: OPTICAL WAVEGUIDE
145: INSIDE RESIN LAYER
146: MIDDLE RESIN LAYER
147: OUTSIDE RESIN LAYER
148: THERMALLY CONDUCTIVE FILLER

BEST MODE FOR CARRYING OUT THE INVENTION

Hereinafter, embodiments of the present invention will be described with reference to the accompanying drawings.

Figure 4:
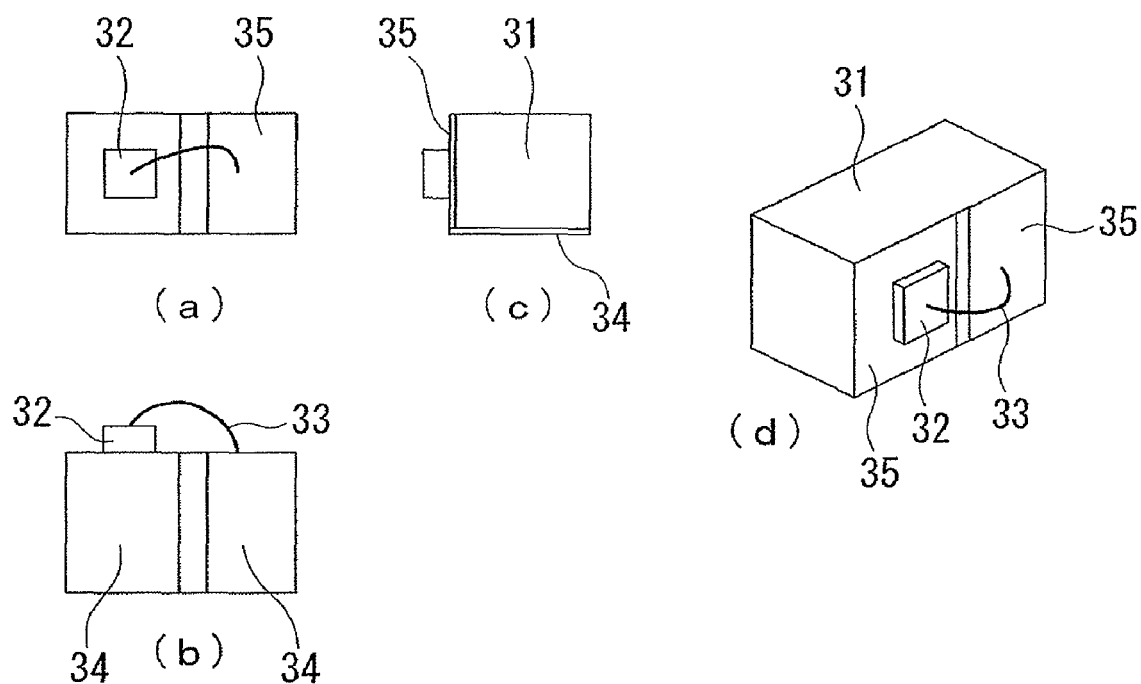
FIG. 4 illustrates a sub-mount substrate in which a light-emitting or receiving element used in a manufacturing method of an optical communication module of the present invention is mounted on the side surface, where (a) is a plan view, (b) is a front view, (c) is a side view, and (d) is a perspective view.
Figure 5:
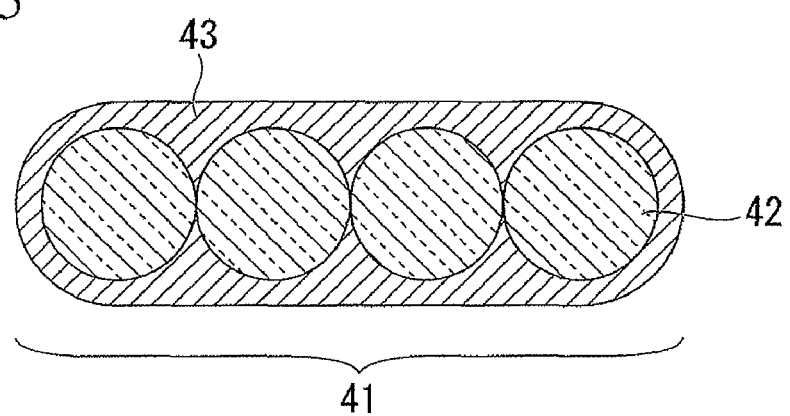
FIG. 5 is a cross-sectional view illustrating a fiber tape which is an example of an optical waveguide used in the manufacturing method of the optical communication module of the present invention.
Figure 6:
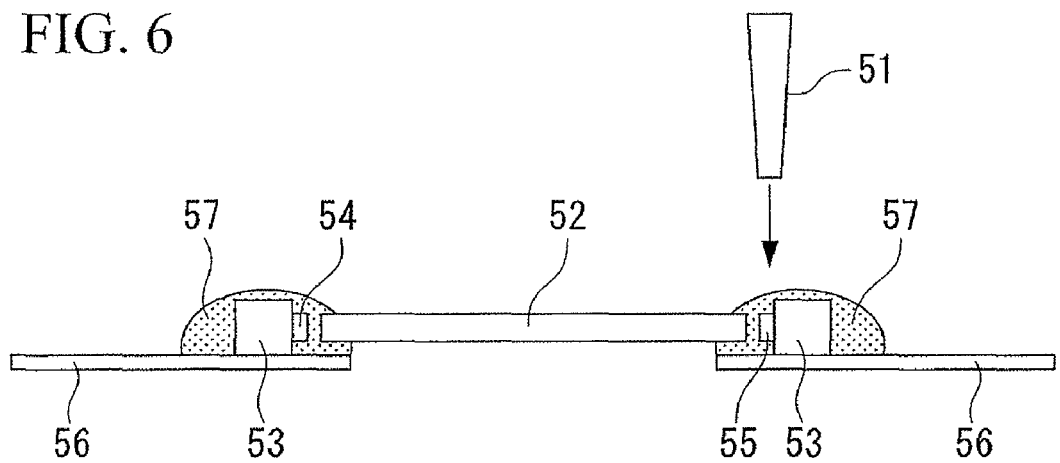
FIG. 6 is a side view illustrating a final process of the manufacturing method of the optical communication module of the present invention.

FIGS. 4 to 6 are views illustrating an embodiment of a manufacturing method of an optical communication module according to the present invention. An item (a) in FIG. 4 is a plan view of a sub-mount substrate in which one side of each of a light-emitting element and light-receiving element (hereinafter, referred to as a light-emitting or receiving element) is mounted on the side surface, an item (b) in FIG. 4 is a front view, an item (c) in FIG. 4 is a side view, and an item (d) in FIG. 4 is a perspective view. FIG. 5 is a cross-sectional view illustrating the fiber tape as an example of an optical waveguide, and FIG. 6 is a side view illustrating the final process of a manufacturing method of an optical communication module.

A manufacturing method of the present invention is characterized in that the following processes are sequentially performed; (1) a process of mounting a light-emitting element and a light-receiving element on a side surface of a sub-mount substrate and mounting the sub-mount substrate on a printed circuit board such that the light-emitting and receiving directions of the light-emitting element and light-receiving element are parallel to the printed circuit board; (2) a process of aligning an optical waveguide; and (3) a process of dropping a resin solution on a sub-mount substrate portion including an optical waveguide end and the light-emitting element or the light-receiving element and of curing the resin solution.

First, the process (1) will be described. A state where a light-emitting or receiving element is mounted on a side surface of a sub-mount substrate is shown in FIG. 4. In FIG. 4, reference numeral 31 denotes a sub-mount substrate, reference numeral 32 denotes a light-emitting or receiving element (VCSEL or PD), reference numeral 33 denotes gold wire, reference numeral 34 denotes a bottom surface electrode, and reference numeral 35 denotes a side surface electrode.

In the manufacturing method of the present invention, the sub-mount substrate 31 may be formed by using a material, such as aluminum nitride or aluminum oxide, in order to achieve compatibility between sufficient insulation and heat dissipation of the heat generated from the light-emitting or receiving element 32 which is mounted.

In addition, the sub-mount substrate 31 has an electrode pattern on the bottom and side surfaces. The bottom surface electrode 34 is bonded to a predetermined electrode pad on the printed circuit board. An anode and a cathode of the light-emitting or receiving element 32 are bonded to the side surface electrode 35.

Usually, the light-emitting or receiving element 32 has a structure where at least one of the anode and the cathode is electrically connected to an electrode by wire bonding.

Since the gold wire 33 is exposed after bonding, it is typical to protect the gold wire by quickly applying sealant after wire bonding. It is desirable that the resin for wire protection not be applied at this point of time. In addition, a conductive paste or the like may be used when fixing the light-emitting or receiving element 32 to the sub-mount substrate or fixing it to the sub-mount substrate so as to be electrically conductive. Since the fixing strength of the conductive paste is low, mold processing using a protective resin is usually needed. However, it is desirable that the protective resin not be applied at this point of time.

After mounting the light-emitting and receiving elements on the side surface of the sub-mount substrate, the sub-mount substrate is mounted on the printed circuit board such that the light-emitting and receiving directions of the light-emitting and receiving elements are parallel to the printed circuit board. A state where the light-emitting or receiving element is mounted onto the printed circuit board is shown in FIG. 6. As shown in FIG. 6, a sub-mount substrate 53, in which a VCSEL 54 that is a light-emitting element is mounted on the side surface, is mounted on a printed circuit board 56 such that the light-emitting direction of the VCSEL 54 is parallel to a printed circuit board 56, and the sub-mount substrate 53, in which a PD 55 that is a light-receiving element is mounted on the side surface, is mounted on the printed circuit board 56 such that the light-emitting direction of the PD 55 is parallel to the printed circuit board 56.

As a means for transporting a sub-mount substrate onto a printed circuit board, it is industrially desirable to use suction type tweezers for the mounting of electronic components. Therefore, with regard to the shape of the sub-mount substrate, a top surface thereof is smooth is preferable. When mounting the sub-mount substrate on the printed circuit board, powder or conductive paste may be used. Particularly when conductive paste is used, mold processing using a protective resin is usually needed because the fixing strength of sub-mount substrate is not sufficient. However, it is desirable that the protective resin not be applied at this point of time.

Next, (2) will be described. In the manufacturing method of the present invention, a sheet type optical waveguide, a fiber type optical waveguide, or the like may be used as an optical waveguide. Particularly in the case of the fiber type optical waveguide, a long waveguide can be manufactured. Accordingly, it is advantageous in that an optical waveguide can be obtained cheaply. A silica glass fiber, a plastic fiber, and the like may be used as the fiber type optical waveguide. In addition, it may also be possible to use a polymer cladding fiber which is a kind of silica glass fiber and in which the core, through which light is guided, is formed of silica glass and a cladding portion around the core is formed of polymer. A plural number of such fiber type waveguides may be collectively mounted by taping and cabling.

FIG. 5 is a view illustrating a fiber tape as an example of the fiber type optical waveguide. This fiber tape 41 has a configuration in which four fiber type optical waveguides 42 are aligned and are collectively coated in the tape form by a taping material 43 formed of a synthetic resin. For example, two-way communication lines may be mounted and fixed at once by mounting a light-emitting element and a light-receiving element on a sub-mount substrate and by taping the silica glass fiber according to the distance between the light-emitting portion and the light-receiving portion. In addition, handling efficiency, heat resistance, strength, and the like of the optical waveguide may be improved by taping and cabling.

As an alignment method of the optical waveguide, either active alignment or passive alignment is possible. A method of setting alignment marks on a sub-mount substrate and an optical waveguide and performing alignment while performing image recognition with a mounting machine is industrially preferable. In case of using the fiber type optical waveguide, the handling performance of suction tweezers of the mounting machine can be improved by taping the fibers.

Next, (3) will be described. In the process (3), a resin solution is dropped onto the sub-mount substrate portion having the optical waveguide end and the light-emitting or receiving element and is cured.

This makes it possible to simultaneously a) protect the bonding wire protruding from the light-emitting or receiving element, b) ensure the strength of the mounting of the light-emitting or receiving element onto the sub-mount substrate, c) fix the optical waveguide, and d) ensure the strength of the mounting of the sub-mount substrate onto the printed circuit board.

As resins used herein, an epoxy-based resin, an acrylic-based resin, a silicone-based resin, a polyimide-based resin, a polysilane-based resin, and the like may be used. Examples of the curing method include UV curing, heat curing, two solution mixing (chemical reaction) curing, and moisture reaction curing. In particular, the UV-curable resin is preferable since the curing time is short and positional deviation between the optical waveguide and the light-emitting or receiving element does not occur easily during the curing.

In the present invention, coupling loss between the light-emitting or receiving element and the optical waveguide can be reduced by preventing Fresnel reflection using a resin whose refractive index after curing is the same as that of the core of the optical waveguide. For example, a resin whose refractive index after curing is 1.40 to 1.60 is preferably used when the silica glass optical fiber is used as the optical waveguide. In addition, a stabilized optical transmission characteristic can be achieved by using a resin whose thermal expansion coefficient after curing is close to those of the sub-mount substrate, optical waveguide, and printed circuit board. Particularly by using a resin whose thermal expansion coefficient is close to that of the printed circuit board, the stabilized optical transmission characteristic can be achieved. Moreover, there is also the effect that the light-emitting or receiving element is sealed from the air, in addition to a) to d). As a result, the stabilization of the optical transmission characteristic is possible.

FIG. 6 is a view illustrating a state of execution of the process (3). In this drawing, reference numeral 51 denotes a dispenser nozzle for dropping a resin solution, reference numeral 52 denotes a polymer cladding fiber (fiber type optical waveguide), reference numeral 53 denotes a sub-mount substrate, reference numeral 54 denotes a VCSEL which is a light-emitting element, reference numeral 55 denotes a PD which is a light-receiving element, reference numeral 56 denotes a printed circuit board, and reference numeral 57 denotes a UV-curable resin. In this illustration, the first sub-mount substrate 53 in which the VCSEL 54 is mounted on the side surface and the second sub-mount substrate 53 in which the PD 55 is mounted on the side surface are mounted on the printed circuit board 56 such that the light-emitting direction or light-receiving direction of each of them is parallel to the printed circuit board 56, the polymer cladding fiber 52 is disposed in a state where the ends thereof are adjacent to a light-emitting portion of the VCSEL 54 and a light-receiving portion of the PD 55, and the UV-curable resin 57 is dropped from the tip of the dispenser nozzle 51 and is cured such that both ends of the polymer cladding fiber 52, and the VCSEL 54 and the PD 55 are sealed. Then, after the curing of the resin, the VCSEL 54 or the PD 55 is mounted on the printed circuit board 56 such that the light-emitting direction or light-receiving direction of each of them is parallel to the printed circuit board 56 and they are optically coupled by the polymer cladding fiber 52, thereby manufacturing the optical communication module.

As shown in FIG. 6, the optical communication module manufactured as described above has the printed circuit board 56, the sub-mount substrate 53 in which one or both the VCSEL 53 that is a light-emitting element and the PD 55 that is a light-receiving element are mounted on the side surfaces, and an optical waveguide (polymer cladding fiber 52) provided between the VCSEL 53 and the PD 55 so as to be able to be optically coupled with these elements, and is characterized in that the VCSEL 53 and the PD 55 are mounted on the printed circuit board 56 through the sub-mount substrate 53 such that the light-emitting and receiving directions of them are parallel to the printed circuit board 56 and the VCSEL 53 and the PD 55 of the sub-mount substrate 53 and the ends of the optical waveguide adjacent to them are covered by the UV-curable resin 57.

This optical communication module can emit and receive light in the direction parallel to the printed circuit board 56. Accordingly, reduction in height (thickness) and miniaturization of the optical communication module can be realized.

Next, an embodiment of the optical transceiver of the present invention will be described.

Figure 11:
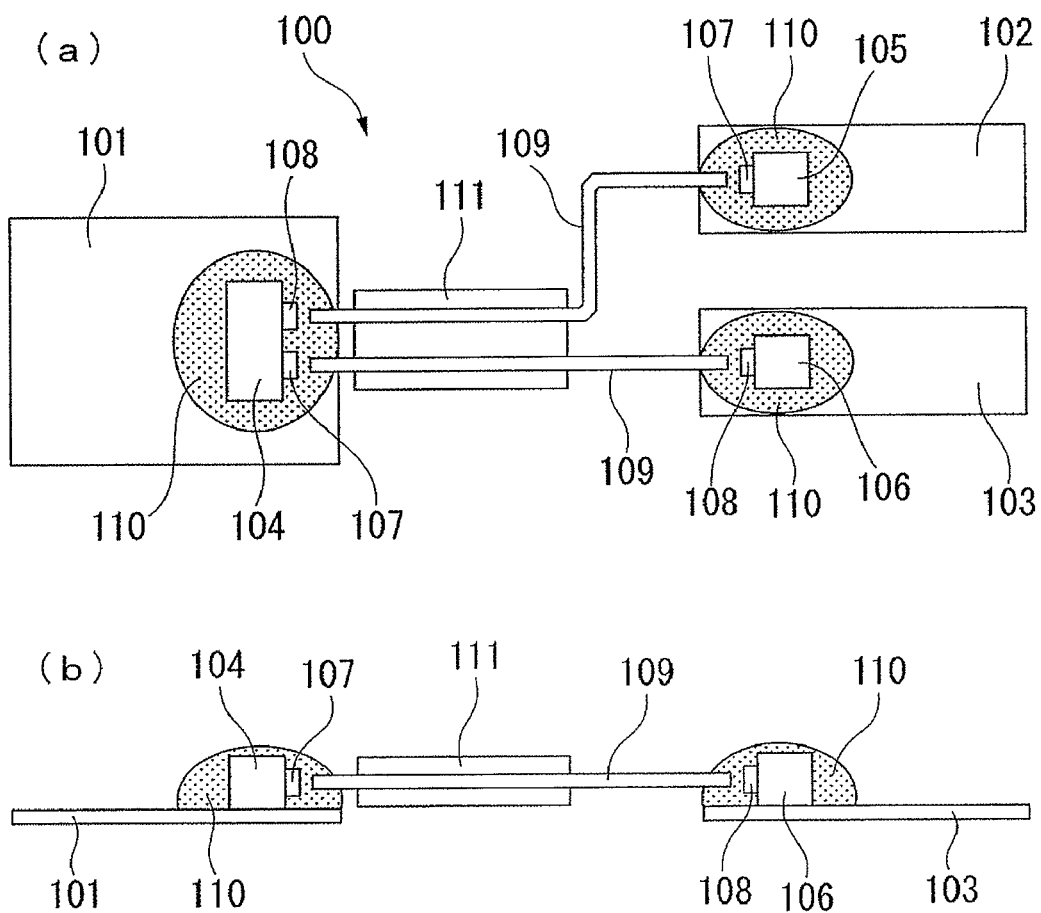
FIG. 11 illustrates an embodiment of an optical transceiver of the present invention, where (a) is a plan view and (b) is a front view.

FIG. 11 illustrates an embodiment of the optical transceiver of the present invention. An item (a) in FIG. 11 is a plan view of an optical transceiver 100, and an item (b) in FIG. 11 is a front view. In this drawing, reference numeral 100 denotes an optical transceiver, reference numerals 101 to 103 denote printed circuit boards, reference numerals 104 to 106 denote sub-mount substrates, reference numeral 107 denotes a light-emitting element, reference numeral 108 denotes a light-receiving element, reference numeral 109 denotes an optical waveguide, reference numeral 110 denotes a resin, and reference numeral 111 denotes a tape sheet.

The optical transceiver 100 of the present embodiment has the printed circuit boards 101 to 103, the sub-mount substrate 104 in which both the light-emitting element 107 and the light-receiving element 108 are mounted, the sub-mount substrate 105 in which the light-emitting element 107 is mounted on the side surface, the sub-mount substrate 106 in which the light-receiving element 108 is mounted on the side surface, and the optical waveguide 109 provided between the light-emitting element 107 and the light-receiving element 108 so as to be able to be optically coupled with these elements, and is characterized in that the light-emitting element 107 and the light-receiving element 108 each have structures in which a surface in contact with the substrate and a surface, through which light is emitted or received, are at the top and bottom positions and the light is emitted or received in a direction perpendicular to the mounted substrate, the light-emitting element 107 and the light-receiving element 108 are mounted on the printed circuit boards 101 to 103 through the sub-mount substrates 104 to 106 such that the light-emitting and receiving directions of them are not perpendicular to the printed circuit boards 101 to 103, and all of the sub-mount substrates 104 to 106, the entire light-emitting element 107, the entire light-receiving element 108, and the ends of the optical waveguide 109 adjacent to them are collectively covered by the resin 110.

Figure 14:
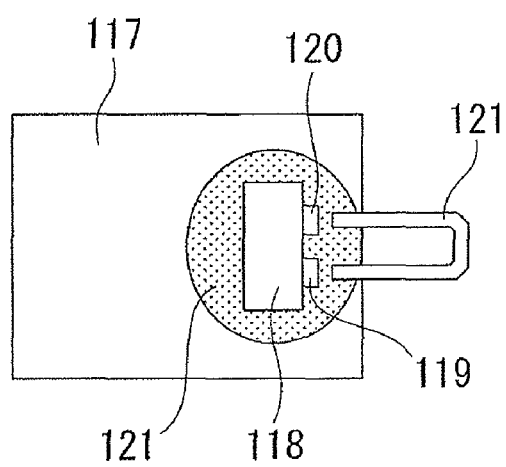
FIG. 14 is a plan view illustrating an optical transceiver of a reference example.

The optical transceiver 100 of the present embodiment has a structure in which the light-emitting elements and the light-receiving elements mounted on the three printed circuit boards 101 to 103 are connected to each other by the two fiber type optical waveguides 109 as shown in FIGS. 11A and 11B. This is different from an optical transceiver with a structure in which a sub-mount substrate 118, in which both a light-emitting element 119 and a light-receiving element 120 are mounted on one side surface, is mounted on a printed circuit board 117, these light-emitting and receiving elements are joined to an optical waveguide 121 which is bent in a U shape, and the entire sub-mount substrate 118, all of the light-emitting element and the light-receiving element, and both ends of the optical waveguide 121 are collectively covered by a resin 122 like a reference example of FIG. 14.

Figure 1:
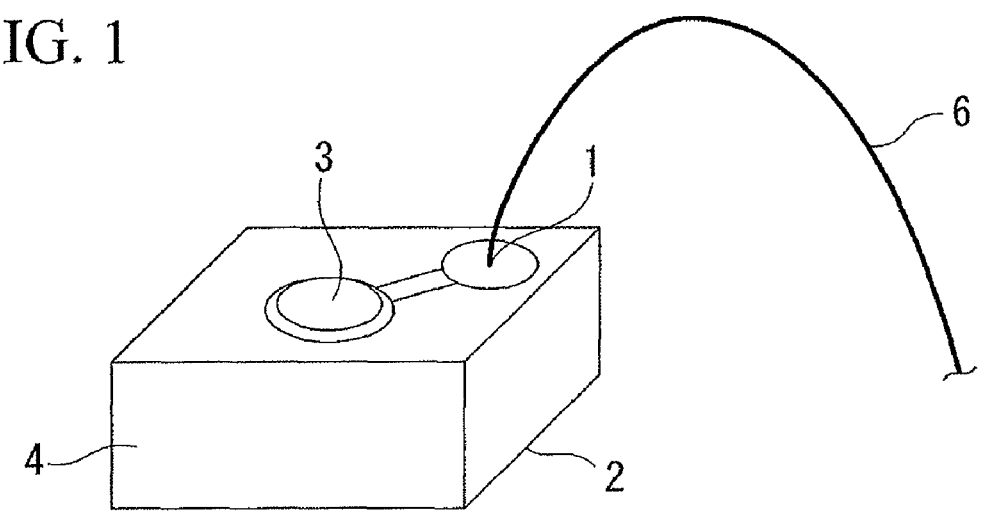
FIG. 1 is a perspective view of a light-emitting element (VCSEL).
Figure 2:
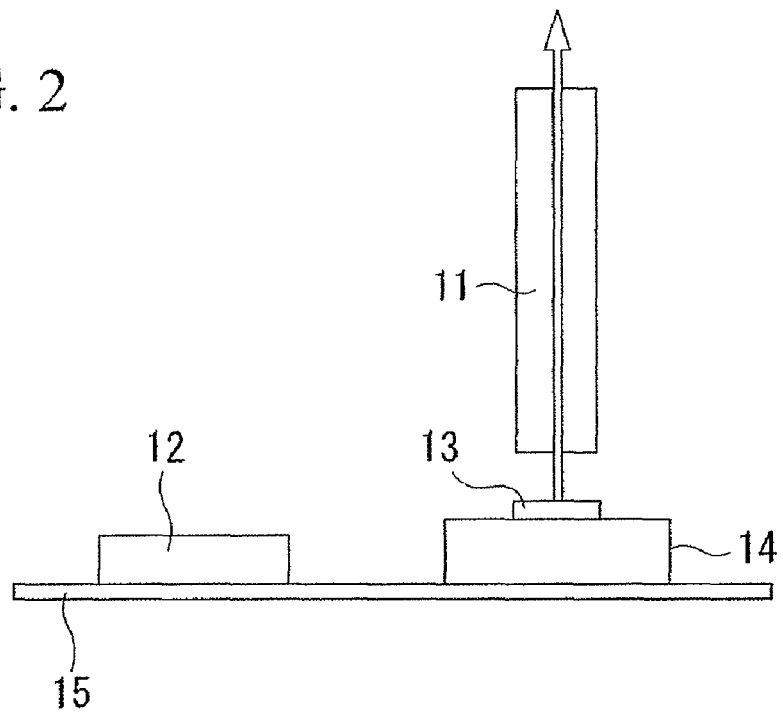
FIG. 2 is a side view illustrating an example of the structure of a known optical communication module.
Figure 3:
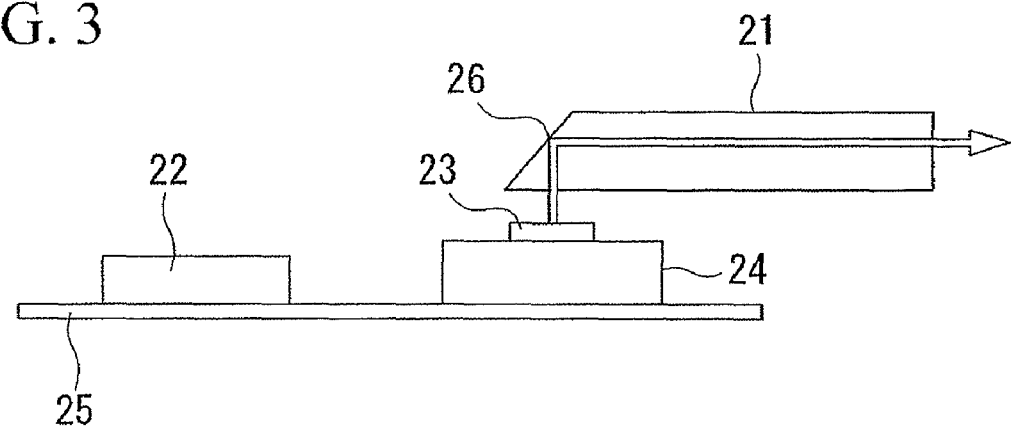
FIG. 3 is a side view illustrating another example of the structure of the known optical communication module.

As shown in FIG. 1, the light-emitting element 107 and the light-receiving element 108 each have structures in which a surface in contact with a support substrate (sub-mount substrate) and a surface, through which light is emitted or received, are at the top and bottom positions and light is emitted or received in a direction perpendicular to the substrate when they are normally mounted. Among light sources with such a structure, as a light source which allows optical wiring to be applied to high-speed communication apparatuses such as servers, optical wiring in automobiles, and small electronic apparatuses such as mobile phones, there is, for example, a vertical cavity surface emitting laser (VCSEL). A laser having the above structure is low in height in the light-emitting and receiving directions and has a feature in that its price is cheap compared with a known LD. In addition, because of the structure of the device, a threshold current for emission is low. As a result, it has a feature in that its power consumption is low. For the above application, a light source which is cheap and has low power consumption is a great advantage.

Figure 12:
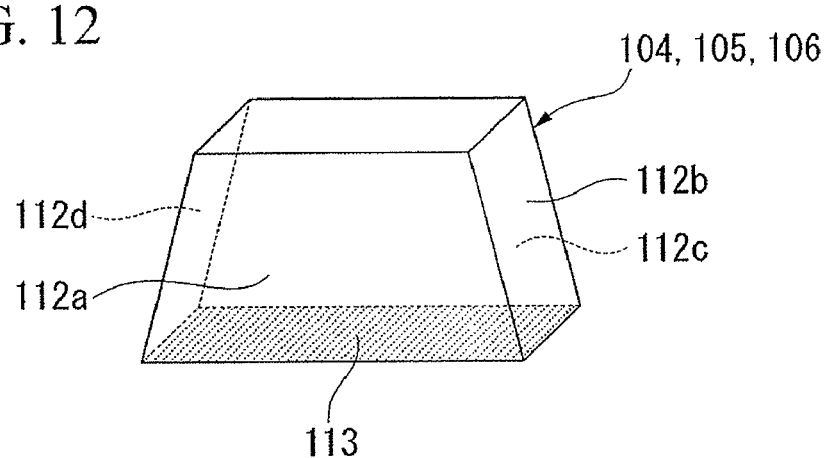
FIG. 12 is a perspective view illustrating an example of the shape of a sub-mount substrate.

The shape of each of the sub-mount substrates 104 to 106 has at least a surface, which is mounted on each of the printed circuit boards 101 to 103, and a surface which is not parallel to the surface and on which the light-emitting or receiving element is mounted. Side surfaces 112a to 112d of the sub-mount substrates 104 to 106 indicate all surfaces, which are not parallel to a surface 113 mounted on the printed circuit board, among the surfaces which form the shapes of the sub-mount substrates 104 to 106, as shown in FIG. 12. By mounting the above-described light-emitting or receiving elements on the side surfaces 112a of the sub-mount substrates 104 to 106, it has a function of setting the light-emitting or receiving direction of the light-emitting or receiving element in an arbitrary direction other than the direction perpendicular to the printed circuit boards 101 to 103.

In the known optical transceiver, in order to emit and receive light in an arbitrary direction with respect to the printed circuit board, the optical path had to be changed using an optical component, such as a mirror. The optical path changing component, such as a mirror, is not desirable because it is expensive. Moreover, in an optical path converter, the coupling efficiency of light is lowered due to scattering and the like, which is disadvantageous. An optical transceiver, in which a light-emitting surface and a light-receiving surface are at the top and bottom positions and which can emit and receive light in an arbitrary direction other than a direction perpendicular to the printed circuit board using a light-emitting or receiving element having a structure in which light is emitted or received in a direction perpendicular to the substrate when it is normally mounted, is groundbreaking since it is possible to reduce the setting space of the optical transceiver and optical waveguide. In addition, when it is placed near a movable portion, bending of the optical waveguide can be reduced. Accordingly, it is also advantageous from the point of view of reliability and the bending loss of the optical waveguide.

Materials with sufficient electrical insulation properties, for example, an aluminum nitride and an aluminum oxide may be used as materials of the sub-mount substrates 104 to 106. Since these materials are excellent in thermal conductivity, the heat generated from the light-emitting element can be efficiently dissipated.

In addition, the sub-mount substrates 104 to 106 have electrode patterns on the bottom and side surfaces, as shown in FIGS. 4A to 4D. The bottom surface electrode 34 is bonded to a predetermined electrode pad on each of the printed circuit boards 101 to 103. An anode and a cathode of a light-emitting or receiving element are bonded to the side surface electrode 35 (refer to FIGS. 4A to 4D). Usually, the light-emitting or receiving element has a structure where at least one of the anode and the cathode is electrically connected to an electrode by wire bonding.

One or both the light-emitting element and the light-receiving element are mounted on the side surfaces of the sub-mount substrates 104 to 106, and the sub-mount substrates 104 to 106 are mounted on the printed circuit boards 101 to 103. As a result, the light-emitting or receiving direction of the light-emitting or receiving element is a direction other than the direction perpendicular to the top surfaces of the printed circuit boards 101 to 103.

A sheet type optical waveguide, a fiber type optical waveguide, or the like may be used as the optical waveguide 109. Particularly in the case of the fiber type optical waveguide, a long waveguide can be manufactured. Accordingly, it is advantageous in that an optical waveguide can be obtained cheaply. A silica glass fiber, a plastic fiber, and the like may be used as the fiber type optical waveguide. In addition, it may also be possible to use a polymer cladding fiber which is a kind of silica glass fiber and in which the core, through which light is guided, is formed of silica glass and a cladding portion around the core is formed of polymer. A plural number of such fiber type optical waveguides may be collectively mounted by taping and cabling.

Also in the illustration shown in FIGS. 11A and 11B, part of a plural number of optical waveguides 109 on the printed circuit board is taped by collectively covering it with the tape sheet 111.

As an alignment method of the optical waveguide 109, either active alignment or passive alignment is possible. A method of setting alignment marks on the sub-mount substrates 104 to 106 and the optical waveguide 109 and performing alignment while performing image recognition with a mounting machine is industrially preferable. In case of using the fiber type optical waveguide, the handling performance of suction tweezers of the mounting machine can be improved by taping a plural number of fibers.

An epoxy-based resin, an acrylic-based resin, a silicone-based resin, a polyimide-based resin, a polysilane-based resin, and the like may be used as the resin 110 which covers collectively all of the sub-mount substrates 104 to 106, the entire light-emitting element 107, the entire light-receiving element 108, and the ends of the optical waveguide 109 adjacent to them. Examples of the curing method include UV curing, heat curing, two solution mixing (chemical reaction) curing, and moisture reaction curing. In particular, the UV-curable resin is preferable since the curing time is short and positional deviation between the optical waveguide 109 and the light-emitting or receiving element does not easily occur during the curing. Covering the entire parts with the resin 110 indicates a state where the resin is also applied to the printed circuit boards 101 to 103 as shown in FIG. 11. As described above, by adopting the structure in which the entire main parts are collectively covered with the resin 110, the following can be performed simultaneously; a) protection of the bonding wire protruding from the light-emitting or receiving element, b) ensuring the strength of the mounting of the light-emitting or receiving element onto the sub-mount substrate, c) fixing of the optical waveguide, and d) ensuring the strength of the mounting of the sub-mount substrate onto the printed circuit board. As a result, it is possible to ensure low cost, low height, and high reliability.

Coupling loss between the light-emitting or receiving element and the optical waveguide 109 can be reduced by preventing Fresnel reflection using the resin 110 whose refractive index after curing is the same as that of the core of the optical waveguide 109. For example, the resin 110 whose refractive index after curing is 1.40 to 1.60 is preferably used when the silica glass optical fiber is used as the optical waveguide 109. In addition, a stabilized optical transmission characteristic can be achieved by using the resin 110 whose thermal expansion coefficient after curing is close to those of the sub-mount substrates 104 to 106, the optical waveguide 109, and the printed circuit boards 101 to 103. Particularly by using a resin whose thermal expansion coefficient is close to that of the printed circuit board, the stabilized optical transmission characteristic can be achieved. Moreover, there is also an effect that the light-emitting or receiving element is sealed from the air, in addition to a) to d). As a result, the stabilized optical transmission characteristic is possible.

The resin 110 is dropped onto a predetermined place and is cured. A dispenser and the like may be used for the dropping.

Figure 13:
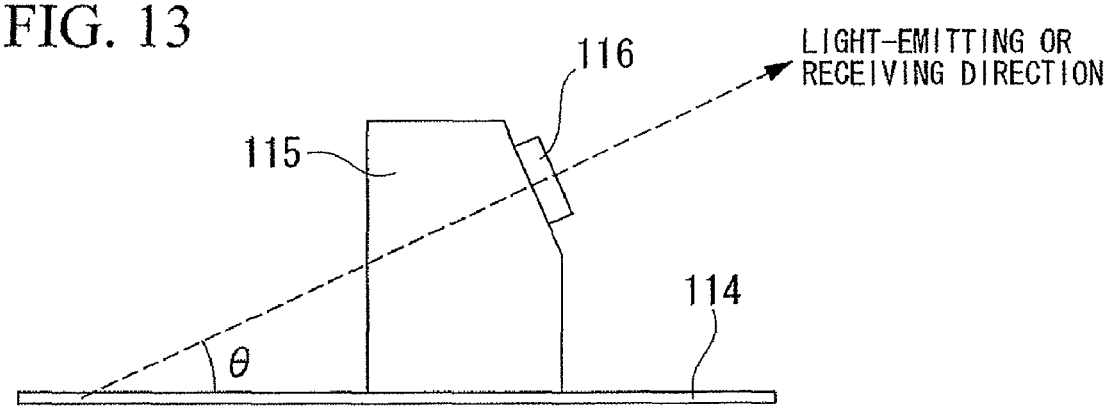
FIG. 13 is a front view of main parts illustrating the light-emitting or receiving direction and the light-emitting or receiving angle θ in a mounted state.

Although this optical transceiver 100 is configured as a device that emits and receives light in an arbitrary direction which is not perpendicular to the printed circuit boards 101 to 103, this angle is defined with reference to FIGS. 12 and 13. In FIGS. 12 and 13, assuming that a direction parallel to a printed circuit board 114, that is, the bottom surface 113 of a sub-mount substrate 115 mounted on the printed circuit board 114 is 0° and the side surfaces 112a to 112d on which a light-emitting or receiving element 116 is mounted is a plus side, the light-emitting or receiving angle θ formed by the bottom surface 114 of the printed circuit board 114 and the light-emitting or receiving direction can be expressed as −90° to 90°. Here, θ=−90° and 90° indicates a direction perpendicular to the printed circuit board 114.

When the light-emitting or receiving angle θ is parallel to the printed circuit board 114 (θ=0°), the total height of the optical transceiver is its lowest. It is suitable for optical wiring inside thin mobile apparatuses, such as mobile phones and notebook PCs. FIG. 11 images the case where the light-emitting or receiving angle θ is 0°.

The polymer cladding fiber mentioned as an example of the optical waveguide 109 is a fiber type optical waveguide with a core-cladding structure in which the core portion is formed of silica glass and the cladding portion is formed of a polymeric material. Since the core portion is silica glass, the polymer cladding fiber shows a high transmission characteristic. Since the cladding portion is formed of a polymeric material, that is, since the diameter of the glass portion which forms the fiber is small, the fiber can be bent with smaller curvature.

In addition, a polymer waveguide may also be used as the optical waveguide 109. This polymer waveguide is a waveguide with a core-cladding structure in which both the core and the cladding are formed of a polymeric material. From the process of manufacture, the cross-sectional shape of the waveguide is a rectangle and in the shape of tape form. Since it is flexible, routing and fixing are easy.

In the optical transceiver 100, the resin 110 is not limited to the single-layer structure and may have a structure in which resin layers of two or three or more layers are laminated.

In addition, when the resin layer 110 is configured to include a plurality of resin layers, a thermally conductive filler may also be mixed in the outermost resin layer. Thus, by mixing the thermally conductive filler in the outside resin layer, an effect such that the heat generated from the light-receiving element or the light-emitting element is dissipated to the outside is improved. As a result, since a temperature change in the inside resin layer caused by generation of heat of the light-emitting or receiving element is reduced, it is possible to solve the problems of deviation of the optical axis or damage of the light-receiving element or light-emitting element. Material and shape of the thermally conductive filler are not particularly limited. For example, a carbon filler and the like may be used. In this case, the inside resin layer is formed of a resin which is transparent to the communication light. Although the material of the transparent resin is not particularly limited, an epoxy resin, an acrylic resin, and the like may be used. Since the inside resin layer serves to perform alignment of the light-receiving element or the light-emitting element and the optical waveguide and to fix them, the short curing time is better. When the curing time is long, there is a possibility that optical axis deviation will occur during the curing.

In addition, a configuration may be adopted where the resin 110 is formed as a three-layer resin layer and the refractive index of the inside resin layer is higher than that of the middle resin layer. By adopting such a structure, the inside resin layer and the middle resin layer form the core-cladding structure. As a result, the coupling efficiency of the light-receiving element or the light-emitting element and the optical waveguide is improved. In addition, by mixing the above-described thermally conductive filler in the outside resin layer, an effect that the heat generated from the light-receiving element or the light-emitting element is dissipated to the outside is improved. As a result, temperature changes in the inside resin layer and middle resin layer caused by generation of heat of the light-emitting or receiving element is reduced.

In this case, the middle resin layer is formed of a resin which is transparent to the communication light, similar to the inside resin layer. Although a material of the transparent resin is not particularly limited, an epoxy resin, an acrylic resin, and the like may be used.

In addition, a configuration may be adopted where the resin 110 is formed as a three-layer resin layer and a transparent filler is mixed in the inside resin layer (and the middle resin layer). Due to the transparent filler of the inside resin layer (and the middle resin layer), the coefficient of linear expansion of a bonding portion between the light-receiving element or the light-emitting element and the optical waveguide end is low. Accordingly, the problems of deviation of the optical axis or damage of the light-receiving element or light-emitting element can be effectively solved.

In this case, although it is needless to say, it is preferable that the refractive index of the transparent filler used for the inside resin layer be the same or almost the same as the refractive index of the resin used for the inside resin layer. If a difference between both the refractive indices increases, scattering becomes noticeable. This is not desirable because the loss of communication light is increased. A material of the transparent filler is not particularly limited. When the wavelength used for communication is that of visible light to near-infrared light, a silica glass filler may be used. The shape of the transparent filler may be a needle shape, a grain shape, and the like and is not particularly limited. However, as disclosed in JP-A-2006-257353, it is preferable that the shape be spherical and capable of suppressing the scattering of communication light by avoiding a region where Mie scattering, in which the particle diameter is one several of the wavelength to several times of the wavelength, easily occurs.

Also when using a transparent filler in the middle resin layer, it is preferable to use a transparent filler with a refractive index close to that of the resin used for the middle resin layer, similar to the case of the inside resin layer.

When the resin 110 having a plurality of layers is provided, it is preferable that the inside resin layer be provided to completely cover at least the entire light-emitting or receiving element, the entire sub-mount substrate, and the optical waveguide end. This makes it possible to improve the bonding strength between the light-receiving element or the light-emitting element and the optical waveguide and to improve the strength when the sub-mount substrate is mounted onto the printed circuit board. Accordingly, the reliability can be improved. In addition, when the transparent filler is mixed in the inside resin layer, the coefficient of linear expansion of the inside resin layer is low. Accordingly, since it becomes more resistant against temperature change, the reliability can be further improved.

First Example

The sub-mount substrate shown in FIG. 4 was manufactured. A material of the sub-mount substrate was an aluminum nitride. An electrode material on the sub-mount substrate was a gold tin alloy in consideration of the bonding strength between the electrode material and gold wire when mounting a light-emitting or receiving element.

As shown in FIG. 4, the light-emitting or receiving element was mounted on the sub-mount substrate. This mounting was performed with conductive silver paste and gold wire. A VCSEL with an emission center wavelength of 850 nm was used as the light-emitting element, and a PD was used as the light-receiving element.

Then, the sub-mount substrate in which the light-emitting or receiving element was mounted on the side surface was mounted on the printed circuit board. Transport of the sub-mount substrate was performed by vacuum tweezers, and it was bonded to an electrode pad of the printed circuit board using conductive silver paste.

Then, alignment and fixing of the optical waveguide was performed. A polymer cladding fiber in which the diameter of the core formed of silica glass was 50 μm was used for the optical waveguide. A fluorine-containing polymer was used for the cladding of the polymer cladding fiber. The alignment was performed in the active alignment method by actually operating the VCSEL and the PD.

Then, the resin was dropped onto the optical waveguide end and the sub-mount substrate portion and was cured. As the resin, a UV-curable resin was used whose refractive index after curing was 1.45. As shown in FIG. 6, an appropriate amount of resin was dropped using an air dispenser so that an optical waveguide end, the VCSEL, the PD, and the sub-mount substrate are fixed. After the dropping of the resin, UV light was irradiated for curing to thereby manufacture the optical communication module.

Using the manufactured optical communication module, the transmission test was performed. At a VCSEL driving speed of 1 GHz, it was driven for 4 hours and there was no error.

Second Example

A video transmission test was performed using the optical communication module which was actually manufactured according to the manufacturing method of the present invention.

As a light-emitting element, a vertical cavity surface emitting laser (VCSEL) with a luminous wavelength of 850 nm and a cutoff frequency of 2.5 GHz was used. As shown in FIG. 1, a commercially available VCSEL was selected which was of a type where the cathode is connected to an electrode by wire bonding and the anode is connected to an electrode using conductive paste.

As a light-receiving element, a GaAs photodiode (PD) with a cutoff frequency of 2.5 GHz was used. Similar to the VCSEL, a commercially available PD with a shape where the cathode is made to be electrically conductive by wire bonding and the anode is made to be electrically conductive by conductive paste was selected.

The same sub-mount substrate as the one described in the first example was used as the sub-mount substrate. The VCSEL and the PD were mounted on the sub-mount substrate using the conductive silver paste and the gold wire.

Then, the sub-mount substrate in which the VCSEL and the PD were mounted on the side surface was mounted. Transport of the sub-mount substrate was performed by vacuum tweezers, and it was bonded to an electrode pad of the printed circuit board using conductive silver paste.

Figure 7:
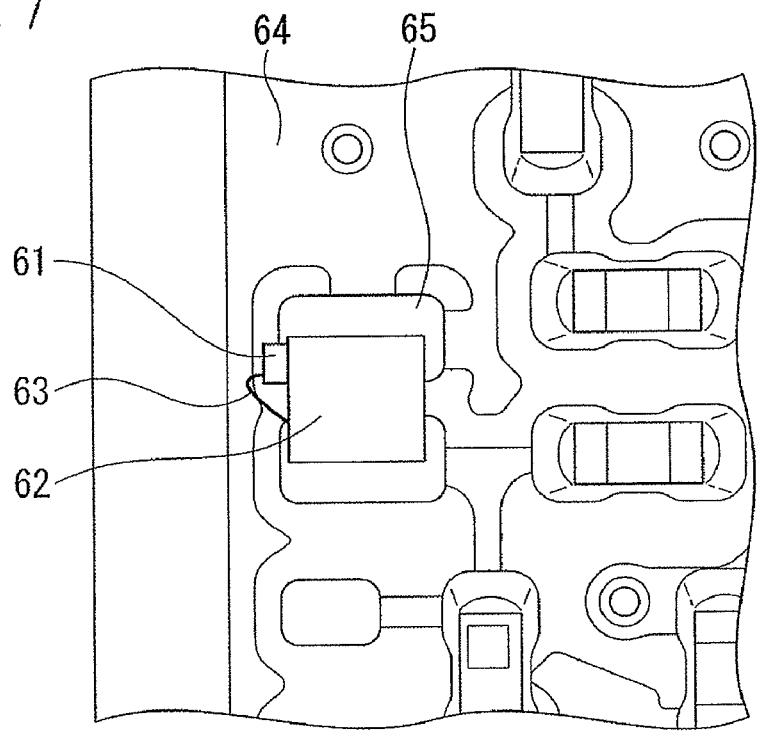
FIG. 7 is a plan view in which main parts on the side of a light-emitting element (VCSEL) of an optical communication module manufactured in a second embodiment are enlarged.
Figure 8:
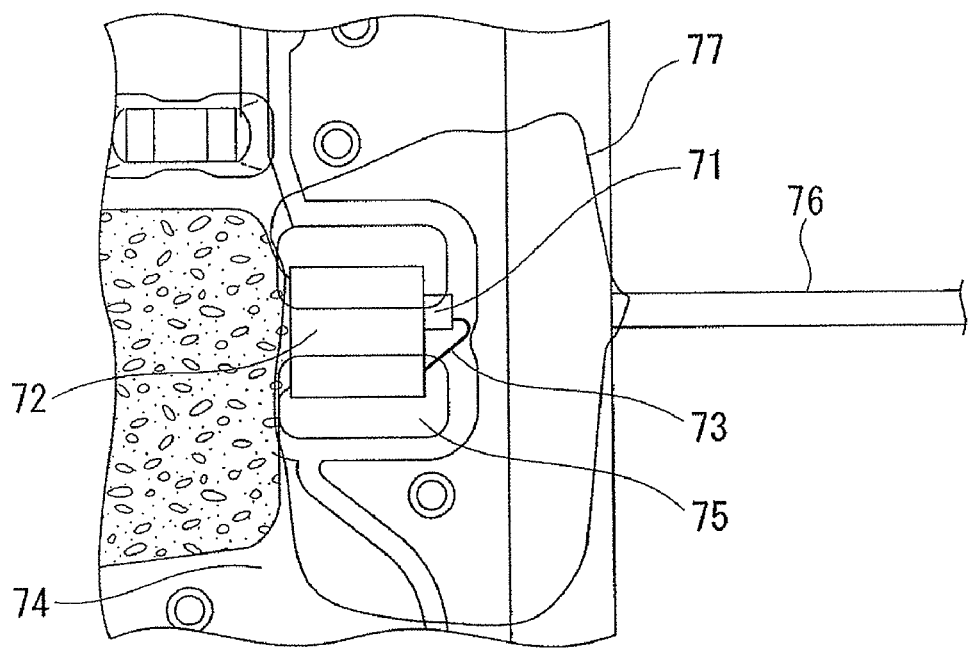
FIG. 8 is a plan view in which main parts on the side of a light-receiving element (PD) of the optical communication module manufactured in the second embodiment are enlarged.

FIG. 7 is an enlarged view of a bonding portion when the sub-mount substrate, in which the VCSEL is mounted on the side surface, is mounted on the printed circuit board. In FIG. 7, reference numeral 61 denotes a VCSEL, reference numeral 62 denotes a sub-mount substrate, reference numeral 63 denotes gold wire, reference numeral 64 denotes a printed circuit board, and reference numeral 65 denotes an electrode. As described in the explanation of the above embodiment, neither a mold resin for protecting the gold wire connected to the VCSEL nor a mold resin for improving the bonding strength between the VCSEL and the sub-mount substrate nor a mold resin for improving the bonding strength between the sub-mount substrate and the printed circuit board was applied at this point of time.

Then, the optical waveguide, the VCSEL, and the PD were aligned and fixed.

A commercially available multi-mode silica glass fiber was used as the optical waveguide. The light propagating core diameter of the glass fiber was 50 μm.

The alignment was performed in the active alignment method by actually operating the VCSEL and the PD. After performing the alignment, an appropriate amount of UV-curable resin whose refractive index after curing was 1.45 was dropped onto the bonding portion of the optical fiber and the VCSEL and the PD and ultraviolet light with a wavelength of 365 nm was irradiated to cure the resin. A commercially available resin was used as the UV-curable resin. Dropping of the resin was performed using the air dispenser similar to the first example.

Figure 9:
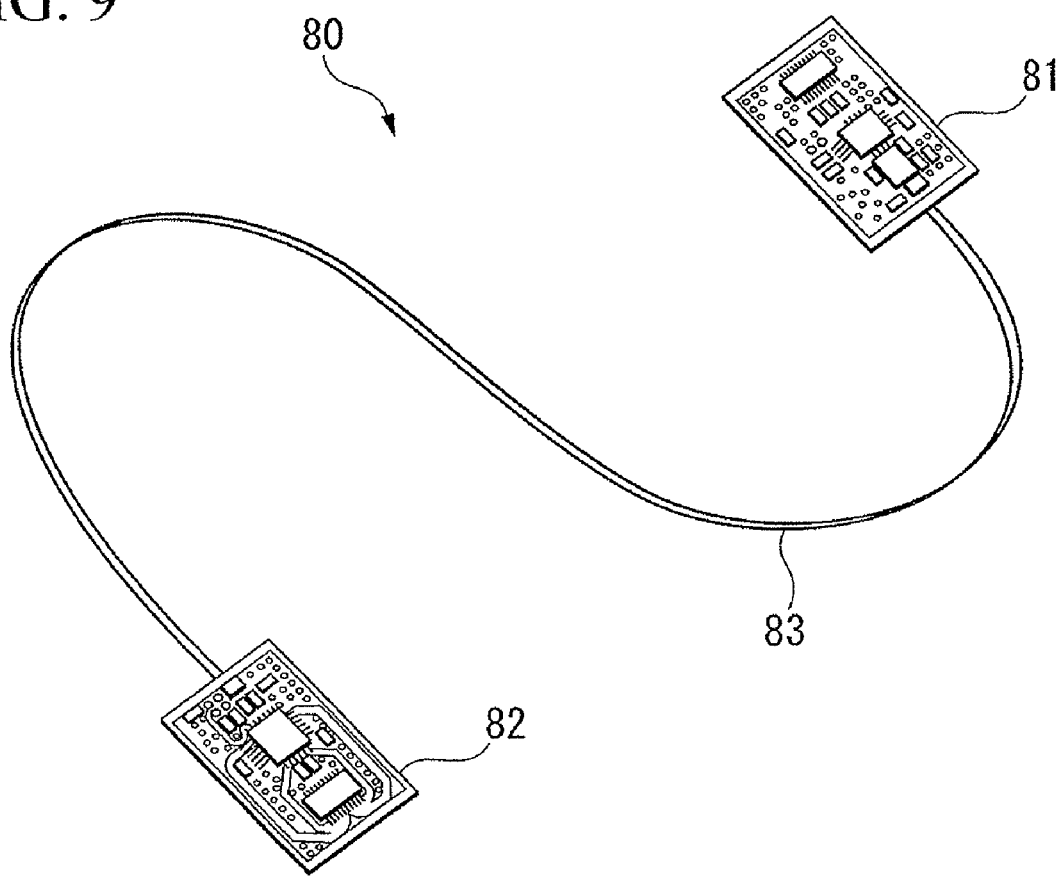
FIG. 9 is a perspective view illustrating the optical communication module manufactured in the second embodiment.

FIG. 9 is an enlarged view of a bonding portion of a PD and an optical fiber after curing of the UV resin. In FIG. 9, reference numeral 71 denotes a PD, reference numeral 72 denotes a sub-mount substrate, reference numeral 73 denotes gold wire, reference numeral 74 denotes a printed circuit board, reference numeral 75 denotes an electrode (printed circuit board), reference numeral 76 denotes an optical fiber, and reference numeral 77 denotes a UV-curable resin.

As described in the above explanation of the embodiment, protection of the gold wire connected to the PD, improvement in the bonding strength between the PD and the sub-mount substrate, and improvement in the bonding strength between the sub-mount substrate and the printed circuit board can be realized by the UV-curable resin which fixes the optical fiber and the PD.

Figure 10:
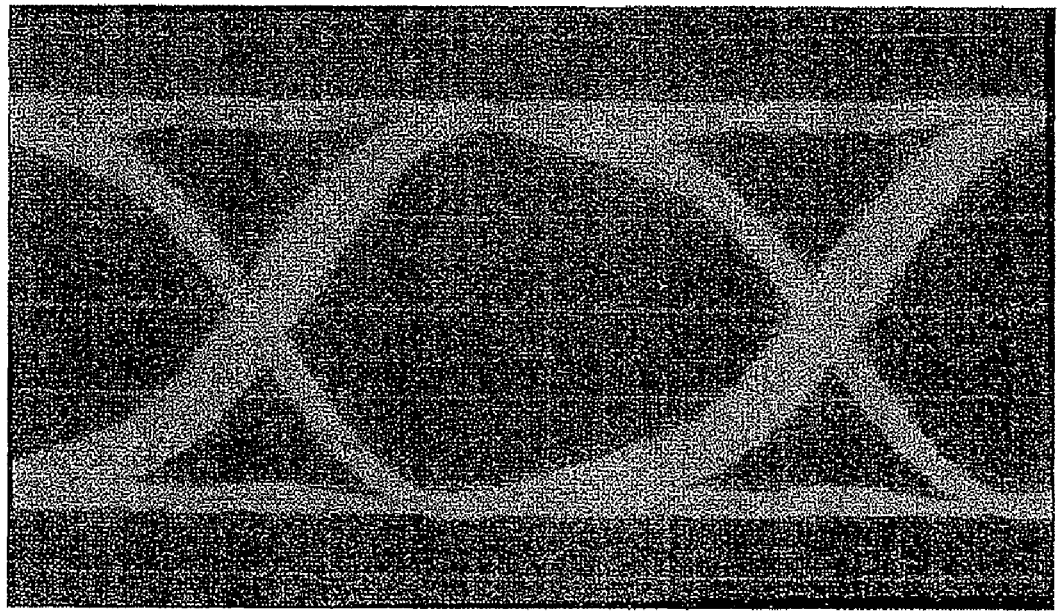
FIG. 10 is a view illustrating the eye pattern measured in the second embodiment.

The entire configuration of the optical communication module manufactured as described above is shown in FIG. 10. In FIG. 10, reference numeral 80 denotes the optical communication module manufactured in this example, reference numeral 81 denotes a printed circuit board on which either a VCSEL or a PD is mounted through a sub-mount substrate, reference numeral 82 denotes a printed circuit board on which either a VCSEL or a PD is mounted through a sub-mount substrate, and reference numeral 83 denotes an optical fiber connected to both the printed circuit boards such that the VCSEL and the PD thereof can be optically coupled.

A transmission test was performed using the optical communication module. The bit error rate in light signal transmission between VCSEL—optical fiber—PD was measured using a commercially available digital data analyzer. At a driving speed of 2.5 GHz, it was driven for 4 hours and there was no error.

In addition, the eye pattern was measured using a commercially available sampling oscilloscope. FIG. 10 shows the measured eye pattern. From the eye pattern shown in FIG. 10, it was confirmed that sufficient opening was obtained in this optical communication module.

In addition, a transmission test of an image signal was performed using the optical communication module. The transmission was performed in the LVDS method after converting an analog signal output from a CCD camera into a digital signal and then serializing it. Analog conversion, serializing, and LVDS-corresponding signal conversion were performed using a commercially available board for communication. As a result of the test, an image of the CCD camera could be transmitted in real time and be displayed on the display.

Third Example

Figure 15:
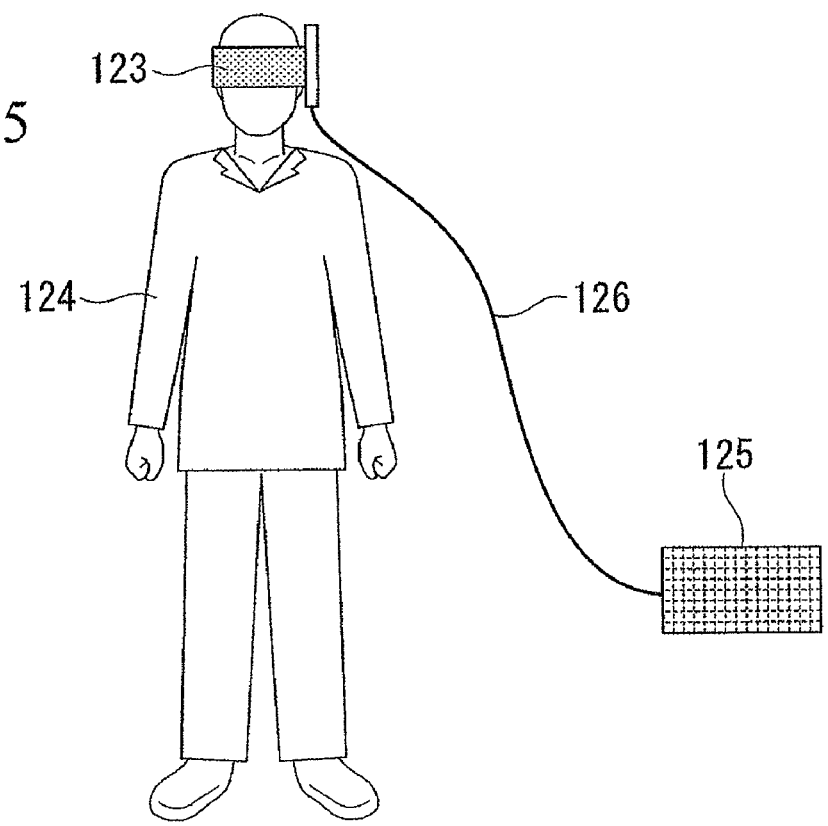
FIG. 15 is a configuration view illustrating the apparatus outline of a head mounted display manufactured in a third embodiment related to the optical transceiver of the present invention.
Figure 16:
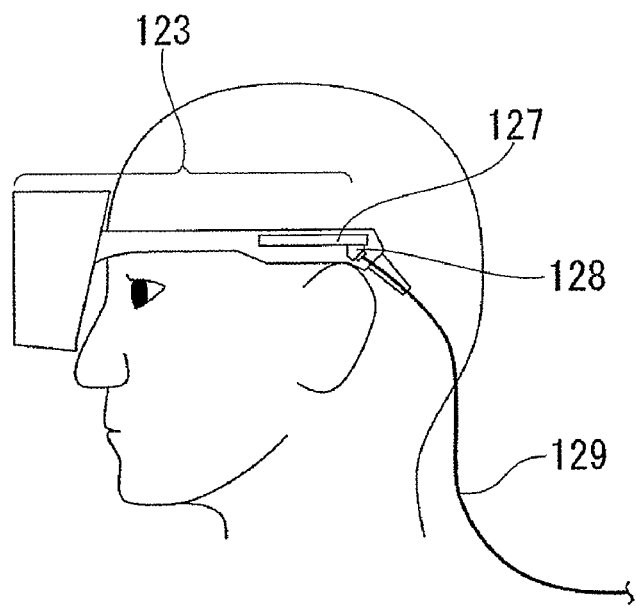
FIG. 16 is a configuration view illustrating the structure of an optical transceiver in the head mounted display of the third embodiment.

An optical transceiver was applied between a head mounted display 123 and its control device 125. The schematic configuration is shown in FIG. 15. This apparatus is the goggle type head mounted display 123 that a test subject 124 wears on the head and is fitted and fixed to the outer periphery of one ear. An optical waveguide 126 is taken out from the rear of the portion fixed to the ear. In order to improve a feeling of fitting to the eye and due to the restrictions in design, as shown in FIG. 16, an extracted portion of the optical waveguide 126 has a structure including a printed circuit board 127 provided at the rear end of the head mounted display 123, a sub-mount substrate 128 mounted on the printed circuit board 127, a light-emitting or -receiving element mounted on the side surface of the sub-mount substrate 128, and an optical waveguide 129 which is connected to the element so as to be able to be optically coupled. Since the head mounted display 123 is small, the printed circuit board 127 of the optical transmitting set is housed at the position shown in FIG. 16. Accordingly, the optical waveguide 129 and the optical transmitting set substrate are not level to each other, and a predetermined angle is formed therebetween. In the test apparatus of this example, an angle of about 50° is formed. As an optical transmitting set applied herein, an optical transmitting set was prepared whose emission angle with respect to the printed circuit board 127 was 50°. This was mounted in the head mounted display test apparatus and the transmission test was performed. For comparison, an optical transmitting set whose emission angle was 0° was prepared and evaluated.

First, the transmission test was performed in a state where the optical transmitting set is mounted in the head mounted display 123. The bit error rate in light signal transmission between VCSEL—optical fiber—PD was measured using a commercially available digital data analyzer. At a driving speed of 1.5 GHz, it was driven for 4 hours and there was no error. In addition, the eye pattern was measured using a commercially available sampling oscilloscope, and it was confirmed that sufficient opening was obtained.

For comparison, the same test was also performed in the optical transmitting set whose emission angle was 0°. As a result, there was no error in a state where the head mounted display 123 was held still. However, when the test subject 124 walked in a state where it was actually mounted on the ear of the test subject 124, turbulence in the eye pattern was large and stable transmission was not possible. When the optical transmitting set was mounted whose emission angle (light-emitting or receiving angle θ) was 0°, it could be seen that the excessive force was applied to the optical fiber base in the optical waveguide 129 extracted portion of the head mounted display 123 and the reliability was reduced.

Fourth Example

Figure 17:
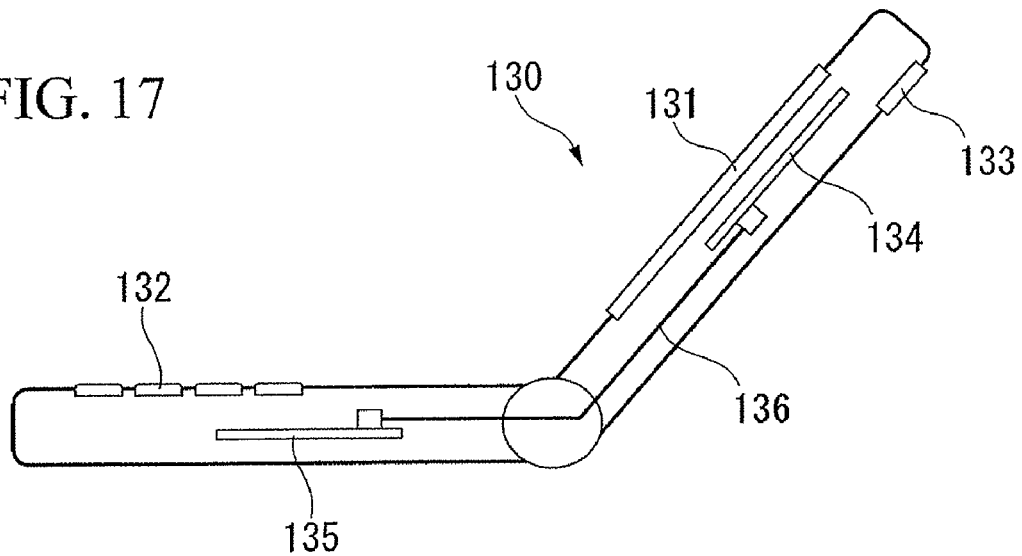
FIG. 17 is a configuration view illustrating the apparatus outline of a mobile phone manufactured in a fourth embodiment related to the optical transceiver of the present invention.

The optical transceiver was applied for the wiring lines in a mobile phone 130. The schematic configuration is shown in FIG. 17. In the drawing, reference numeral 130 denotes the mobile phone, reference numeral 131 denotes a liquid crystal display, reference numeral 132 denotes a key pad, reference numeral 133 denotes a camera module, reference numerals 134 and 135 denote printed circuit boards, and reference numeral 136 denotes an optical waveguide.

In thin electronic apparatuses including mobile phones, it is necessary that the height of a component mounted on the printed circuit board be 1 mm or less, and there is a demand for further reduction in height. By applying an optical transmitting set and an optical receiving set with light-emitting and -receiving angles of 0° in order to meet such a demand, an optical transceiver with a height of 0.7 mm from the printed circuit board which includes a light-emitting or -receiving element, an optical waveguide, and a fixing resin can be realized. The configuration of the apparatus is shown in an item (a) in FIG. 18. In the item (a) in FIG. 18, reference numeral 135 (134) denotes a printed circuit board, reference numeral 136 denotes an optical waveguide, reference numeral 137 denotes a sub-mount substrate, reference numeral 138 denotes a VCSEL which is a light-emitting element, and reference numeral 139 denotes a resin which collectively covers them.

In addition, the sizes a to f of the respective portions in the item (a) in FIG. 18 were as follows. a=0.70 mm, b=0.50 mm, c=0.30 mm, d=0.25 mm, e=0.10 mm, f=0.25 mm. A silica glass fiber with an external diameter of 80 μm was used as the optical waveguide 136. This silica glass fiber has an external diameter of 125 μm by coating the outer side with a UV-curable urethane resin. In addition, a UV-curable epoxy resin was used as the resin 139.

The sub-mount substrate 137 was manufactured by an injection molding method using the liquid crystal polymer. Mounting of the light-emitting or receiving element onto the sub-mount substrate 137, mounting of the sub-mount substrate 137 onto the printed circuit boards 134 and 135, and mounting of the optical waveguide 136 onto the printed circuit boards 134 and 135 were performed using an automatic machine (mounter) for mounting electronic components.

Since there is a size error in an injection-molded product and a mounting position accuracy error in an automatic machine, an error occurs according to the capability of the mounting machine even if an optical transceiver with a light-emitting or -receiving angle of θ=0° is manufactured. In this test, in order to investigate the tolerance to the manufacture error, a sample intentionally inclined in the range of −3° to 3° was also manufactured.

Figure 18:
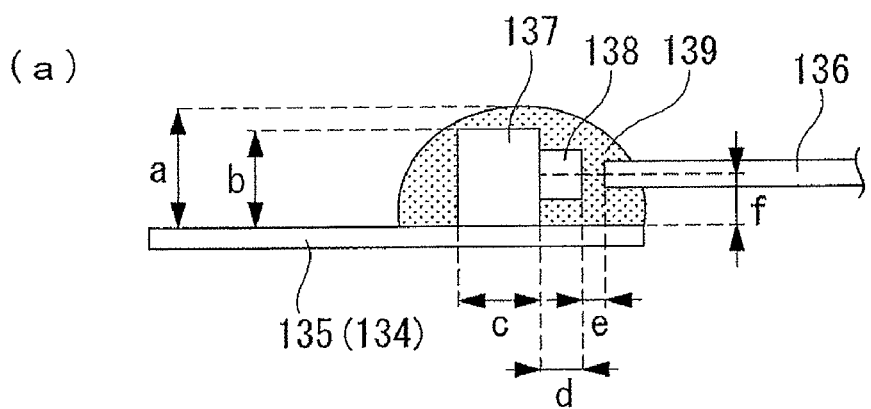
FIG. 18 illustrates the structure of an optical transceiver provided in the mobile phone manufactured in the fourth embodiment, where (a) is a front view of main parts and (b) is a configuration view illustrating an example of the relationship between the fiber deviation angle and the amount of increase in height.
Figure 18:
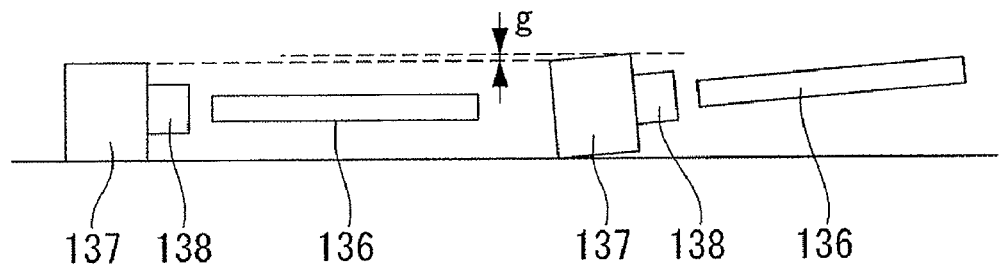

In addition, since fiber angle deviation may also occur as shown in an item (b) in FIG. 18 in addition to emission angle deviation and receiving angle deviation, a sample with fiber angle deviation in the range of −3° to 3° was also manufactured. In addition, the fiber deviation angle is defined as an angle formed by the centerline of the fiber and a top surface of the printed circuit board.

When the sizes a to f of the respective portions in the item (a) in FIG. 18 are taken into consideration, it can be seen that a sufficient reduction in height can be realized even if the emission angle deviates by several degrees. In addition, a transmission test was performed using the optical transceivers with the deviations. As a result, a transmission characteristic which was not inferior and which was sufficiently stabilized compared with the optical transceiver with no deviation could be realized. For example, when the fiber deviation angle is 5° in the fiber deviation shown in the item (b) in FIG. 18, a height increment g is 0.03 mm or less which results in only a slight increase.

Figure 19:
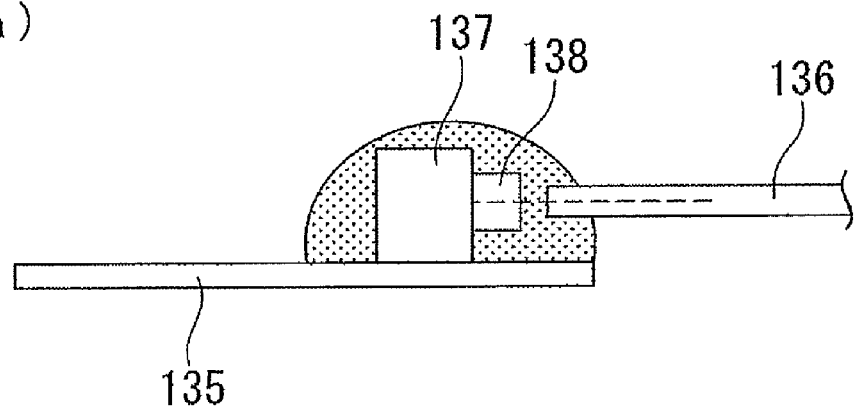
FIG. 19 illustrates the angle deviation occurring in the optical transceiver, where (a) is a front view of main parts in a state where there is no angle deviation, (b) is a front view of main parts illustrating a state of emission angle deviation, and (c) is a front view of main parts illustrating a state of fiber angle deviation.
Figure 19:
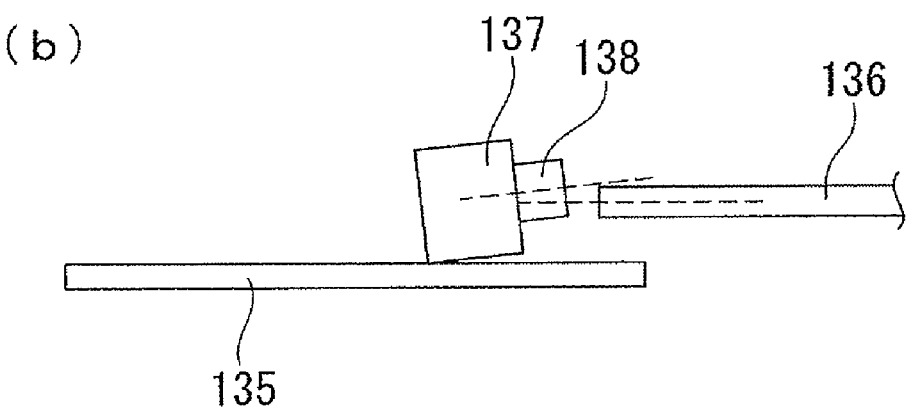
Figure 19:
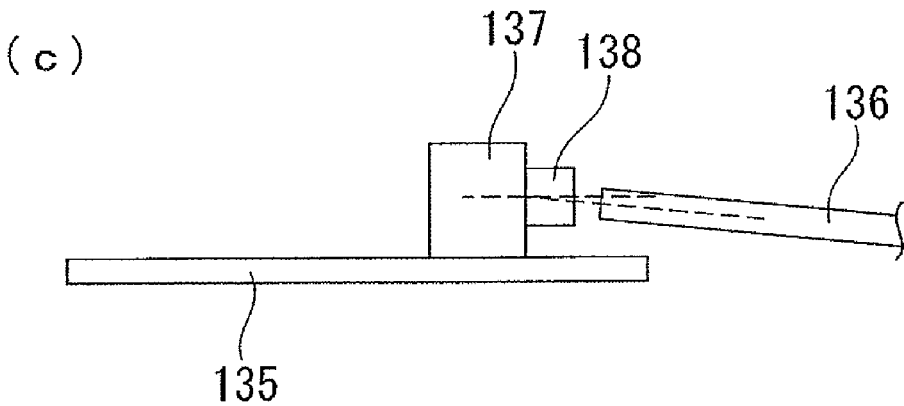

FIG. 19 illustrates the patterns of angle deviation thought to occur in the optical transceiver shown in the item (a) in FIG. 18. An item (a) in FIG. 19 is a front view of main parts of an optical transceiver with no angle deviation, an item (b) in FIG. 19 is a front view of main parts illustrating a state of emission angle deviation, and an item (c) in FIG. 19 is a front view of main parts illustrating a state of fiber angle deviation. In addition, although the emission angle deviation when the VCSEL 138 is mounted is illustrated in the item (b) in FIG. 19, the same is true for the receiving angle deviation when a light-receiving element, such as a PD, is mounted.

Causes of the occurrence of the emission/receiving angle deviation include deviation when the sub-mount substrate 137 is mounted on the printed circuit board 135 (134) and deviation when the light-emitting or -receiving element is mounted on the sub-mount substrate 137. The item (b) in FIG. 19 corresponds to the former deviation.

In the optical transceiver of the present invention, it could be seen that practically sufficient light transmission and reception functions could be realized if it is an angle deviation of several degrees including the angle deviation shown in FIGS. 19(b) and 19(c). Presumably, the reason is that the coupling efficiency between the light-emitting or -receiving element and the optical waveguide can be improved by comparatively rough optical axis alignment and a change in the coupling efficiency caused by the physical stress from the outside is small since the light-emitting or -receiving element and the optical waveguide end are collectively fixed by the resin whose refractive index was controlled. Accordingly, in manufacturing the optical transceiver of the present invention, it is thought that they are substantially the same modules even if there is a deviation of several degrees.

Fifth Example

Figure 20:
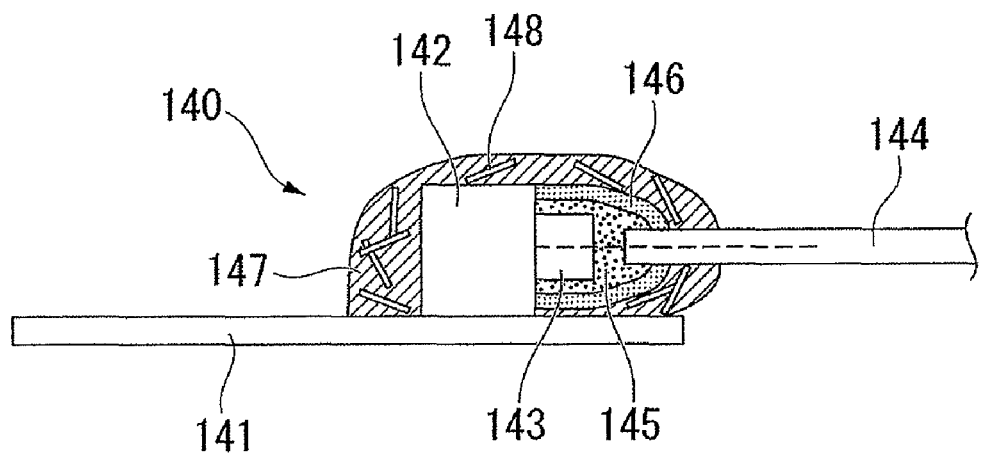
FIG. 20 is a cross-sectional view of an optical transceiver manufactured in a fifth embodiment.

As shown in FIG. 20, an optical transceiver 140 was manufactured which had a structure where a sub-mount substrate 142, in which a light-emitting element 143 or a light-receiving element was mounted on the side surface, was mounted on a printed circuit board 141, one end of an optical fiber type optical waveguide 144 was joined to the light-emitting element 143, and the entire light-emitting element 143, the entire sub-mount substrate 142, and the end of the optical waveguide 144 were covered with three resin layers of an inside resin layer 145, a middle resin layer 146, and an outside resin layer 147 in which a thermally conductive filler 148 was mixed.

As the light-emitting element 143, a VCSEL with an emission center wavelength of 850 nm was used. As the inside resin layer 145, an ultraviolet curable epoxy resin was used whose refractive index after curing was 1.457 and in which 10 mass % of silica glass filler, whose refractive index was adjusted, was mixed. As the middle resin layer 164, an ultraviolet curable epoxy resin was used whose refractive index after curing was 1.452 and in which 10 mass % of silica glass filler, whose refractive index was adjusted, was mixed. As the outside resin layer 147, an ultraviolet curable epoxy resin was used in which 10 mass % of carbon filler as the thermally conductive filler 148 was mixed. As the optical waveguide 144, an optical fiber formed of silica glass was used.

A sample using an epoxy resin, which did not contain a filler in each of the inside, middle, outside resin layers, was also manufactured for comparison.

Figure 21:
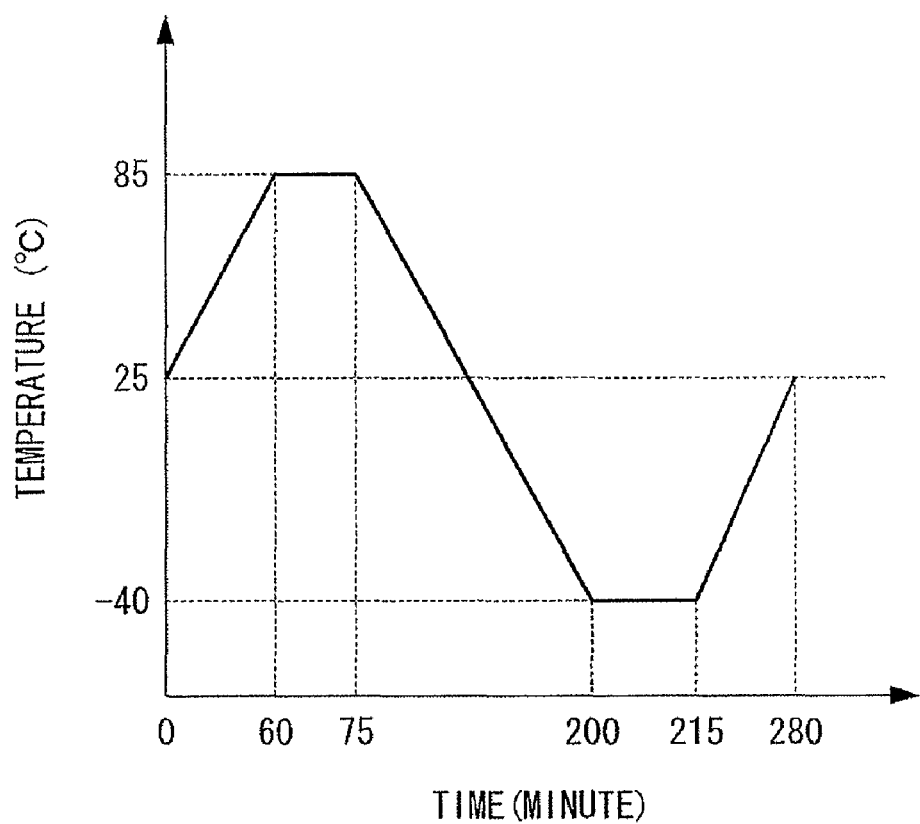
FIG. 21 is a graph illustrating the conditions of a heat cycle test performed in a fifth embodiment.

A heat cycle test was performed for the manufactured sample. The test was performed by making the VCSEL emit light with emission output of 0.3 mW. 500 cycle processing was performed, with the diagram shown in FIG. 21 as 1 cycle, and bonding portions between the VCSEL of the sample after the processing, the resin layer, and the optical fiber were observed with an optical microscope.

In samples (with no filler) manufactured for comparison, a small number of samples were found in which a bonding portion between the VCSEL and the resin and a bonding portion between the optical fiber and the resin peeled off. In samples in which the filler was added to the resin layer, there was hardly any bonding peeling found. As a result, it was seen that the sample, in which the filler was added to the resin layer, was resistant against the heat cycle.

Moreover, in the fifth embodiment, a commercially available filler was used as the silica glass filler. When it is difficult to adjust the refractive index with a commercially available silica glass filler, it is possible to use it after synthesizing the silica glass filler using a gas phase synthesis method. As a raw material, a silicon tetrachloride, for example, may be used. A spherical silica glass filler can be obtained by mixing the vapor of the silicon tetrachloride with a carrier gas, such as argon and nitrogen, and oxygen, transporting it to a synthesis chamber, and heating it up to 800° to 1500°. In order to adjust the refractive index of the silica glass filler, for example, it is preferable to mix the vapor of germanium tetrachloride, aluminum trichloride, and the like with the vapor of the silicon tetrachloride and to synthesize it. Elements, such as germanium and aluminum, can increase the refractive index of silica glass when added to the silica glass. The amount of increase in the refractive index may be adjusted according to the amount added.

INDUSTRIAL APPLICABILITY

According to the manufacturing method of the optical communication module of the present invention, a thin and small optical communication module can be produced efficiently and cheaply.

The invention claimed is:

1. An optical communication module comprising: a printed circuit board including an electrode pad; sub-mount substrates including a bottom surface electrode which is bonded to the electrode pad, a light-emitting element, a light-receiving element, and a laterally placed side surface electrode to which an anode and a cathode of the light-emitting or the receiving element are bonded by wire bonding, in which one or both the light-emitting element and the light-receiving element being mounted on a side surface of the sub-mount substrates; and an optical waveguide provided between the light-emitting element and the light-receiving element so as to be able to be optically coupled with the light-emitting element and the light-receiving element, wherein the light-emitting element and the light-receiving element are mounted on the printed circuit board with the sub-mount substrate therebetween such that the light-emitting and -receiving directions of the elements are parallel to the printed circuit board, and the light-emitting element and the light-receiving element of the sub-mount substrate and ends of the optical waveguide adjacent to the elements are covered by a resin.

2. The optical communication module according to claim 1,
wherein the resin is a UV-curable resin.

3. The optical communication module according to claim 1,
wherein the optical waveguide is one or two or more selected from a silica glass fiber, a polymer cladding fiber, and a plastic fiber.

4. The optical communication module according to claim 1,
wherein the optical waveguide is a silica glass fiber or a polymer cladding fiber, and
the refractive index of the resin after curing is within a range of 1.40 to 1.60.

5. The optical communication module according to claim 1,
wherein the optical waveguide is a polymer cladding fiber in which the diameter of the core formed of silica glass is 100 μm or less.

6. The optical communication module according to claim 1,
wherein the optical waveguide is a fiber tape with a tape shape, and an alignment mark for alignment is provided on the fiber tape.

7. An optical transceiver comprising: a printed circuit board including an electrode pad; sub-mount substrates including a bottom surface electrode which is bonded to the electrode pad, a light-emitting element, a light-receiving element, and a laterally placed side surface electrode to which an anode and a cathode of the light-emitting or the receiving element are bonded by wire bonding, both the light-emitting element and the light-receiving element being mounted on a side surface of the sub-mount substrates; and an optical waveguide provided between the light-emitting element and the light-receiving element so as to be able to be optically coupled with the light-emitting element and the light-receiving element, wherein the light-emitting element and the light-receiving element each have structures in which a surface in contact with the substrate and a surface, through which light is emitted or received, are at the top and bottom positions and the light is emitted or received in a direction perpendicular to the mounted substrate, the light-emitting element and the light-receiving element are mounted on the printed circuit board with the sub-mount substrate therebetween such that the light-emitting and receiving directions of the elements are not perpendicular to the printed circuit board, and the entire sub-mount substrate, the entire light-emitting element, the entire light-receiving element, and ends of the optical waveguide adjacent to the elements are collectively covered by a resin.

8. The optical transceiver according to claim 7,
wherein the resin also covers a part of the printed circuit board.

9. The optical transceiver according to claim 7,
wherein bonding wire for conducting an electric current to the light-emitting element and the light-receiving element is collectively covered by the resin.

10. The optical transceiver according to claim 7,
wherein the optical waveguide is one or two or more selected from a group including a silica glass fiber, a polymer cladding fiber, a plastic fiber, and a polymer waveguide.

11. The optical transceiver according to claim 7,
wherein the optical waveguide is a silica glass fiber, and
the refractive index of the collectively covering resin after curing is within a range of 1.40 to 1.60.

12. The optical transceiver according to claim 7,
wherein the light-emitting and receiving directions of the light-emitting element and light-receiving element are parallel to the printed circuit board.

13. The optical transceiver according to claim 7,
wherein the resin consists of two layers or three or more layers.

14. The optical transceiver according to claim 13,
wherein a thermally conductive filler is mixed in the outermost layer of said resin having two layers or three or more layers.

\* \* \* \* \*